United States Patent
He et al.

(10) Patent No.: US 11,329,410 B2
(45) Date of Patent: May 10, 2022

(54) ELECTRICAL CONNECTOR WITH A TERMINAL HAVING A MOVABLE CONTACT PORTION

(71) Applicant: Tyco Electronics (Shanghai) Co. Ltd., Shanghai (CN)

(72) Inventors: Jiayong He, Shanghai (CN); Guangming Zhao, Shanghai (CN); Zhengguo Sun, Shanghai (CN); Hua Li, Shanghai (CN)

(73) Assignee: Tyco Electronics (Shanghai) Co. Ltd., Shanghai (CN)

( * ) Notice: Subject to any disclaimer, the term of this patent is extended or adjusted under 35 U.S.C. 154(b) by 40 days.

(21) Appl. No.: 16/685,427

(22) Filed: Nov. 15, 2019

(65) Prior Publication Data
US 2020/0161783 A1    May 21, 2020

(30) Foreign Application Priority Data
Nov. 15, 2018    (CN) .......................... 201811360185.1

(51) Int. Cl.
*H01R 12/70*    (2011.01)
*H01R 12/79*    (2011.01)
*H01R 12/71*    (2011.01)
*H05K 3/36*    (2006.01)

(52) U.S. Cl.
CPC ....... *H01R 12/7076* (2013.01); *H01R 12/714* (2013.01); *H01R 12/79* (2013.01); *H05K 3/365* (2013.01)

(58) Field of Classification Search
CPC combination set(s) only.
See application file for complete search history.

(56) References Cited

U.S. PATENT DOCUMENTS

| | | | | |
|---|---|---|---|---|
| 4,845,589 A | * | 7/1989 | Weidler | H01R 25/162 361/614 |
| 5,431,576 A | * | 7/1995 | Matthews | H01R 13/113 439/247 |
| 6,508,656 B2 | * | 1/2003 | Chevassus-More | H02B 11/04 439/212 |
| 7,581,972 B2 | * | 9/2009 | Daamen | H01R 13/6315 439/249 |
| 8,388,389 B2 | * | 3/2013 | Costello | H01R 13/18 439/839 |
| 9,054,456 B2 | * | 6/2015 | Orris | H01R 13/112 |

(Continued)

FOREIGN PATENT DOCUMENTS

CN    109038003 A    12/2018

OTHER PUBLICATIONS

Abstract of CN 109038003, dated Dec. 18, 2018, 1 page.

*Primary Examiner* — Edwin A. Leon
*Assistant Examiner* — Milagros Jeancharles
(74) *Attorney, Agent, or Firm* — Barley Snyder

(57) ABSTRACT

An electrical connector adapted to electrically connect a conductive strip to a circuit board includes a housing having a main body with a receiving chamber, a first terminal fixed in the receiving chamber and electrically connected to the conductive strip, and a second terminal fixed on the circuit board. The first terminal has a movable contact portion extending out of the receiving chamber. The movable contact portion of the first terminal electrically contacts the second terminal while being moveable with respect to the second terminal.

22 Claims, 6 Drawing Sheets

(56) References Cited

U.S. PATENT DOCUMENTS

| | | | |
|---|---|---|---|
| 9,331,409 B2* | 5/2016 | Naganuma | H01R 12/7047 |
| 9,871,309 B2* | 1/2018 | Gao | H01R 13/11 |
| 10,581,196 B2* | 3/2020 | Liu | H01R 13/6215 |
| 10,651,578 B2* | 5/2020 | Li | H01R 13/629 |
| 10,784,623 B2* | 9/2020 | Schneider | H01R 13/112 |
| 2012/0115345 A1* | 5/2012 | Mulfinger | H05K 7/1457 |
| | | | 439/296 |
| 2013/0090011 A1* | 4/2013 | Bolouri-Saransar | H01R 13/658 |
| | | | 439/620.15 |

\* cited by examiner

ELECTRICAL CONNECTOR WITH A TERMINAL HAVING A MOVABLE CONTACT PORTION

CROSS-REFERENCE TO RELATED APPLICATION

This application claims the benefit of the filing date under 35 U.S.C. § 119(a)-(d) of Chinese Patent Application No. 201811360185.1, filed on Nov. 15, 2018.

FIELD OF THE INVENTION

The present invention relates to an electrical connector and, more particularly, to an electrical connector with a terminal having a movable contact portion.

BACKGROUND

A circuit board is generally electrically connected to a power device, for example, a conductive strip, through an electrical connector to transmit electrical current or signals. An electrical connector includes an insulated housing, a conductive terminal having a contact electrically connected with the conductive strip, and a fixing portion that is fixedly connected to the circuit board. The electrical connector is typically secured entirely to the circuit board by soldering, bolting, or other means via the fixing portion.

When the circuit board and the conductive strip are properly mounted in place, the electrical connector is properly connected between the circuit board and the conductive strip. A large installation deviation can occur between the circuit board and the conductive strip, and because the electrical connector is fixedly connected to the circuit board, when the electrical connector is connected between the circuit board and the conductive strip which have been assembled, a large internal stress is generated in the interior of the electrical connector. The internal stress decreases the contact reliability of the terminals inside the electrical connector.

SUMMARY

An electrical connector adapted to electrically connect a conductive strip to a circuit board includes a housing having a main body with a receiving chamber, a first terminal fixed in the receiving chamber and electrically connected to the conductive strip, and a second terminal fixed on the circuit board. The first terminal has a movable contact portion extending out of the receiving chamber. The movable contact portion of the first terminal electrically contacts the second terminal while being moveable with respect to the second terminal.

BRIEF DESCRIPTION OF THE DRAWINGS

The invention will now be described by way of example with reference to the accompanying Figures, of which.

DETAILED DESCRIPTION OF THE EMBODIMENT(S)

Figure 1:
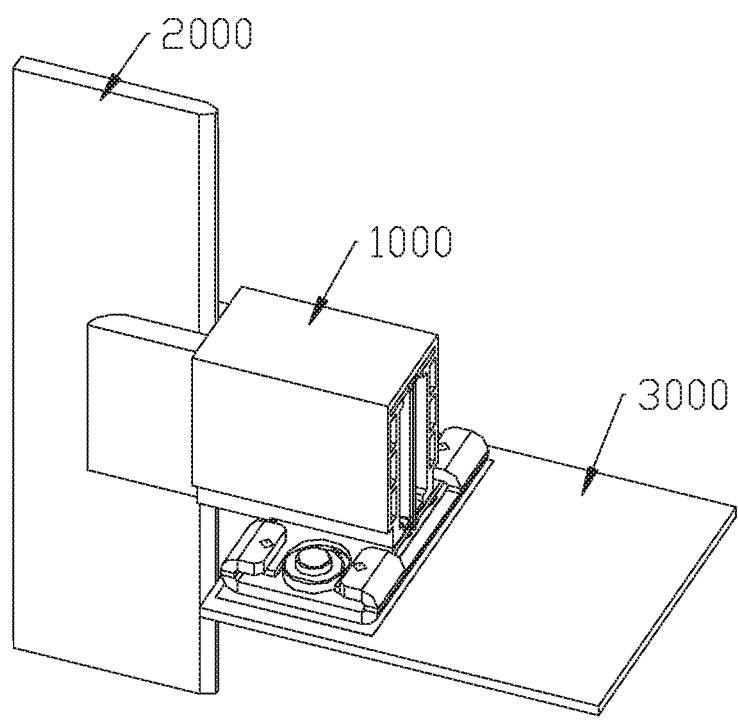
FIG. 1 is a perspective view of an electrical connector according to an embodiment connected between a conductive strip and a circuit board.

The technical solution of the present disclosure will be described hereinafter in further detail with reference to the following embodiments, taken in conjunction with the accompanying drawings. In the specification, the same or similar reference numerals indicate the same or similar parts. The description of the embodiments of the present disclosure hereinafter with reference to the accompanying drawings is intended to explain the general inventive concept of the present disclosure, and should not be constructed as a limitation to the present disclosure.

In addition, in the following detailed description, for the sake of explanation, numerous specific details are set forth in order to provide a thorough understanding of the disclosed embodiments. It will be apparent, however, one or more embodiments may also be practiced without these specific details. In other instances, well-known structures and devices are illustrated schematically in order to simplify the drawing.

As shown in FIG. 1, an electrical connector 1000 according to an embodiment is adapted to electrically connect a conductive strip 2000 to a circuit board 3000. The electrical connector 1000, as shown in FIGS. 2 and 3, comprises a housing 100 having a main body 110, the main body 110 being provided with a receiving chamber 111, at least one first terminal 200 fixed in the receiving chamber 111 and adapted to be electrically connected to the conductive strip 2000, and a second terminal 300 adapted to be fixed on the circuit board 3000.

Figure 2:
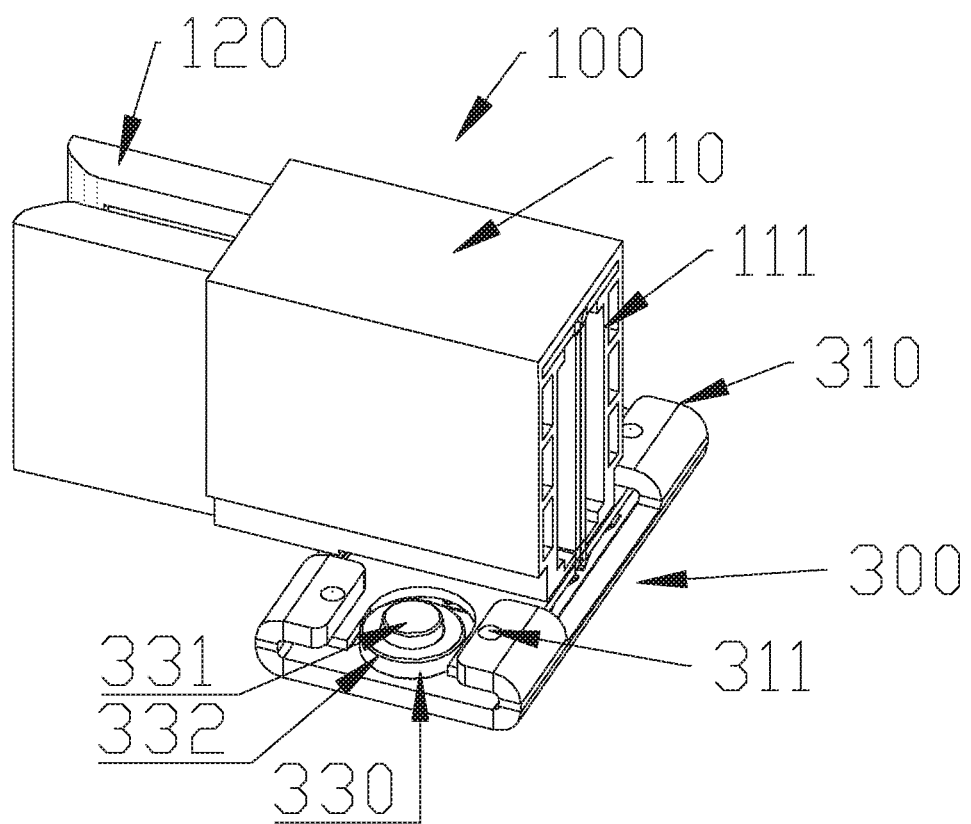
FIG. 2 is a perspective view of the electrical connector.
Figure 3:
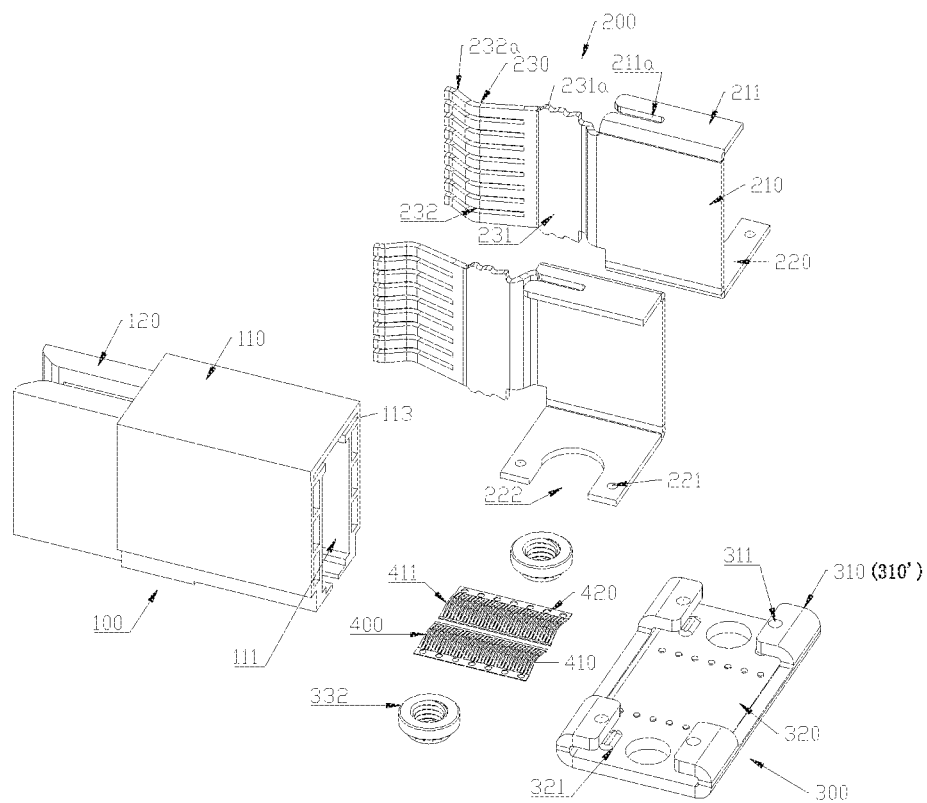
FIG. 3 is an exploded perspective view of the electrical connector.

Each of the first terminals 200, as shown in FIGS. 2 and 3, has a movable contact portion 220 extending out of the receiving chamber 111. The movable contact portion 220 of the first terminal 200 is adapted to be brought into an electrical contact with the second terminal 300 while being moveable with respect to the second terminal 300. Each first terminal 200 has a fixing portion 210 for fixing the first terminal 200 in the receiving chamber 111.

As shown in FIG. 1, a plane where the conductive strip 2000 is located is substantially perpendicular to a plane where the circuit board 3000 is located.

As shown in FIG. 3, two first terminals 200 are provided in the electrical connector 1000 of the shown embodiment, and the movable contact portions 220 of the two first terminals 200 are respectively perpendicular to the fixing portions 210 thereof and extend away from each other. The second terminal 300 includes a plurality of first guide grooves 310, and the movable contact portions 220 of the two first terminals 200 are respectively movably inserted into the first guide grooves 310 in a first direction (in FIGS. 2 and 3, the first direction is a direction where the guide grooves 310 extend) parallel to the plane where the circuit board 3000 is located.

As shown in FIG. 3, the second terminal 300 includes a flat portion 320 adapted to electrically contact the circuit board 3000 and at least one pair of bent portions 310'. Each bent portion 310' extends curvedly from an edge of the flat portion 320 above a surface of the flat portion 320 opposite to the circuit board 3000 so as to form one first guide grooves 310. In the embodiment shown in FIG. 3, two pairs of bent portions 310' are provided on the second terminal 300, and thus two pairs of guide grooves 310 are formed in which the movable contact portions 220 of the two first terminals 200 slide, respectively.

Figure 4:
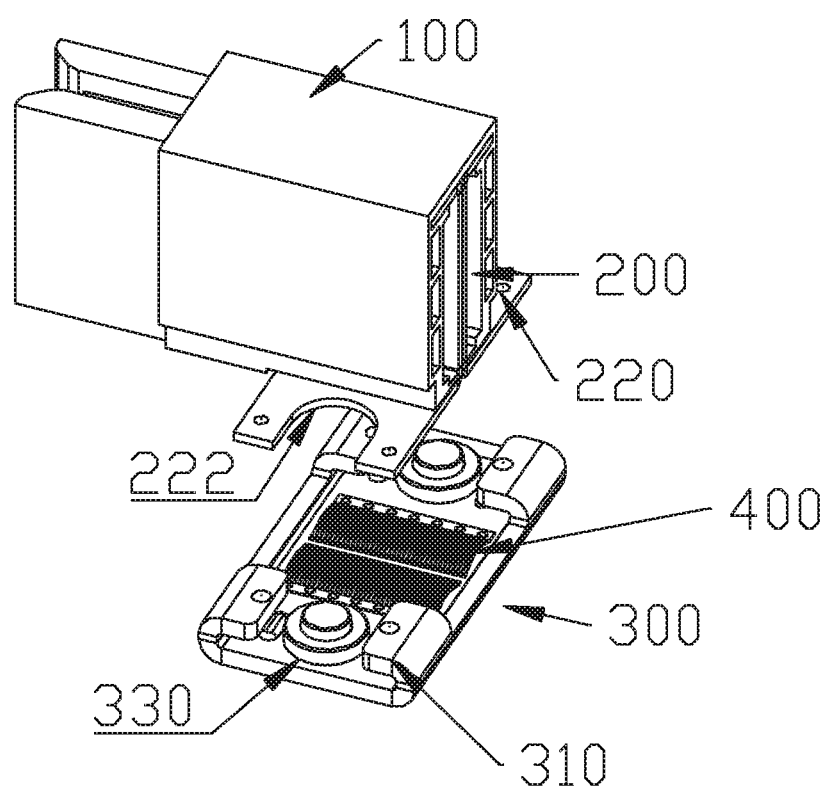
FIG. 4 is a perspective view of the electrical connector with a second terminal separated from a first terminal.

As shown in FIG. 4, the second terminal 300 is separated from the first terminal 200, and the first guide groove 310 is configured to allow the movable contact portion 220 of the first terminal 200 to move in a second direction parallel to the plane where the circuit board 3000 is located and perpendicular to the first direction. As shown in FIGS. 1 and 4, a width between each pair of guide grooves 310 of the second terminal 300 in the second direction is set to be slightly larger than a width of the movable contact portion 220 of the first terminal 200 in the second direction, but not wide to the extent that both sides of the movable contact portion 220 of the first terminal 200 may not be properly inserted into each pair of guide grooves. However, the movable contact portion 220 of the first terminal 200 may have a small movement in the second direction perpendicular to the first direction, in addition to sliding in the first direction in which the guide grooves 310 extend and the movable contact portion 220 is inserted into the respective guide grooves 310.

The electrical connector 1000, as shown in FIGS. 3 and 4, includes an elastic mechanism 400 disposed between the movable contact portion 220 of the first terminal 200 and the flat portion 320 of the second terminal 300 to allow the movable contact portion 220 to move relative to the flat portion 320 in a third direction perpendicular to the plane where the circuit board 3000 is located. The elastic mechanism 400 is bulged in a direction away from the plane where the circuit board 3000 is located, and abuts against the movable contact portion 220 of the first terminal 200 when the first terminal 200 and the second terminal 300 are mounted in place. However, since the elastic mechanism 400 itself has elasticity, the first terminal 200 may have a certain displacement in the third direction perpendicular to the plane where the circuit board 3000 is located.

The elastic mechanism 400, as shown in FIG. 3, includes two elastic sheets 410 each elastic sheet 410 having a protrusion 411 protruding away from the flat portion 320, and a plurality of connecting parts 420 adapted to connect an edge of the elastic sheet 410 to the flat portion 320. As shown in FIG. 4, when the first and second terminals 200 and 300 are mounted in place, the two elastic sheets 410 abut against the movable contact portions 220 of the two first terminals 200, respectively, under the respective movable contact portions 220.

The elastic sheet 400, shown in FIGS. 3 and 4, cooperates with the guide grooves 310 to clamp the movable contact portion 220. Since the elastic sheet 400 has a certain elasticity, the clamping force for clamping the movable contact portion 220 is not large. When the electric connector 1000 of the shown embodiment is connected between the conductive strip 2000 and the circuit board 3000, the movable contact portion 220 of the first terminal 200 of the electric connector may overcome the clamping force to slide in the guide grooves 310, so that the electric connector 1000 may be deformed without generating internal stress.

As shown in FIGS. 2 and 4, the second terminal 300 has two stoppers 330 that are provided to limit the movable contact portions 220 of the two first terminals 200 to move between the two stoppers 330 in the first direction. The movable contact portion 220 of the first terminal 200 has a notch 222 into which the stopper 330 is matched. This allows a relatively compact construction.

Figure 6:
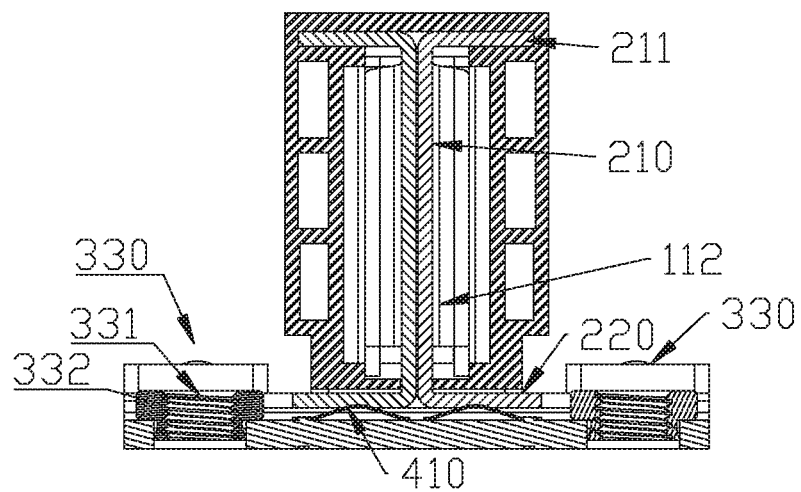
FIG. 6 is a sectional side view of the electrical connector, taken along line X1-X1 of FIG. 5.

The electrical connector 1000, as shown in FIGS. 2 and 6, includes a bolt member 331 passing through the circuit board 3000 and the flat portion 320 of the second terminal 300, and a nut member 332 engaged with the bolt member 331 to fix the second terminal 300 to the circuit board 3000. The nut member 332 or a bolt head of the bolt member 331 serves as the stopper 330.

Figure 7:
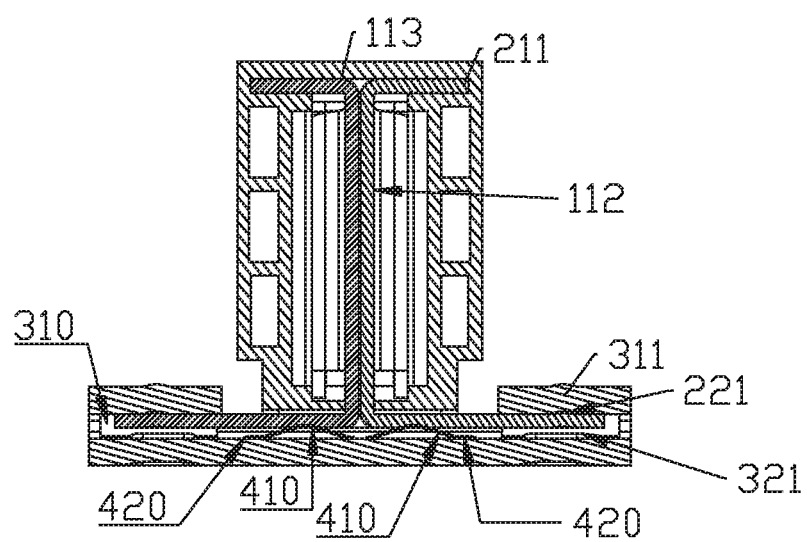
FIG. 7 is a sectional side view of the electrical connector, taken along line X2-X2 of FIG. 5.

As shown in FIGS. 2 and 3, at least one recess portion 311 is provided on one of the first guide groove 310, especially the bent portion, and the movable contact portion 220, and a protruding portion 221 cooperated with the recess portion 311 is provided on the other of the first guide groove 310 and the movable contact portion 220. The recess portion 311 is configured to receive the protruding portion 221. As shown in FIGS. 3 and 7, at least one recess portion 311 is provided on the first guide groove 310, and the protruding portion 221 cooperated with the recess portion 311 is provided on the movable contact portion 220. A boss 321 is provided on the flat portion 320 at a position corresponding to the recess portion 311 to help clamp the movable contact portion 220.

Figure 5:
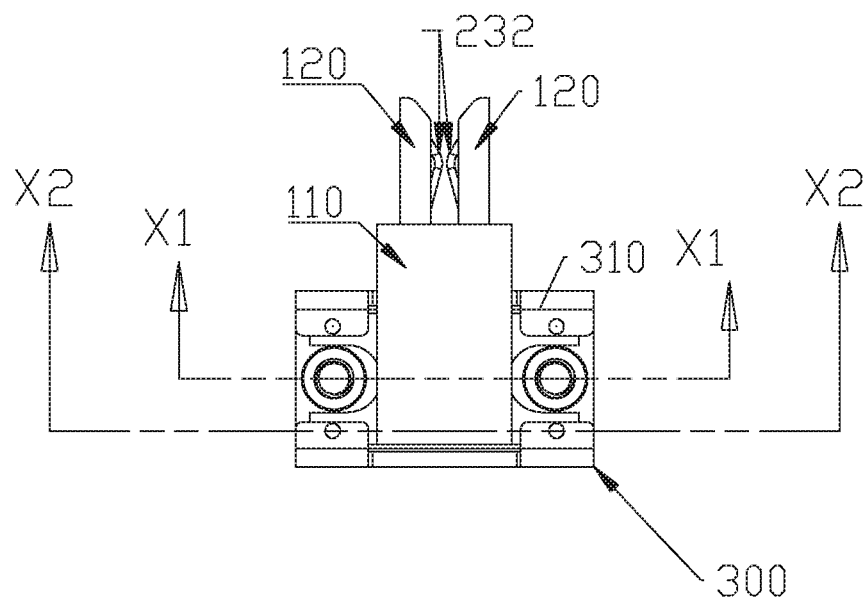
FIG. 5 is a top view of the electrical connector.

As shown in FIGS. 3 and 5, the electrical connector 1000 further includes two holding arms 120 facing each other and extending out of the main body 110. The holding arms 120 are used to insulate a portion of the first terminal 200 contacting the conductive strip 2000 from the outside environment.

As shown in FIG. 3, each first terminal 200 includes a contact 230 extending from the fixing portion 210 to the holding arm 120 to make electrical contact with the conductive strip 2000 inserted between the holding arms 120. As shown in FIGS. 3 and 5, the contact 230 of each of the first terminals 200 includes a base 231 extending from the fixing portion 210 and a folded portion 232 protruding toward the conductive strip 2000 so as to clamp the conductive strip 2000. The folded portion 232 includes a plurality of elastic arms 232a spaced apart from one another. Both sides of the base 231 have a plurality of holding portions 231a protruding outward and adapted to penetrate into an inner wall of the receiving chamber 111.

As shown in FIGS. 6 and 7, the electrical connector 1000 has a second guide channel 112. The fixing portions 210 of the two first terminals 200 pass through the second guide channel. Side portions of the fixing portions 210 of the two first terminals 200 opposite to the movable contact portions 220 are respectively provided with reinforcing portions 211, and these two reinforcing portions 211 extend substantially perpendicular to the fixing portions 210 and extend away from each other. The reinforcing portion 211 is partially inserted into a holding groove 113 disposed at an upper portion of the receiving chamber 111.

As shown in FIG. 3, the reinforcing portion 211 has a slot 211a, and the holding groove 113 has a corresponding rib (now shown), which is inserted into the slot 211a to reinforce the fixation between the first terminal 200 and the electrical connector 1000.

In the foregoing exemplary embodiments, because a free movement may occur between the first terminals 200 and the second terminal 300 without affecting the conductivity, even if there is a large mounting deviation between the circuit board 3000 and the conductive strip 2000, a large stress will not occur inside the electrical connector 1000 when being connected between the circuit board 3000 and the conductive strip 2000.

It should be appreciated by those skilled in the art that the above embodiments are intended to be illustrative, modifications may be made to the above embodiments by those skilled in the art, and structures described in various embodiments may be freely combined without having structural and principle conflict.

Although the present disclosure has been described with reference to the attached drawings, the embodiments disclosed in the drawings are intended to illustrate the embodiments of the present disclosure, but should not be constructed as a limitation to the present disclosure.

Although several exemplary embodiments have been shown and described, it would be appreciated by those skilled in the art that various changes or modifications may be made in these embodiments without departing from the principles and spirit of the disclosure, the scope of which is not defined by the exemplary embodiments of the present disclosure, but defined in the claims and their equivalents.

What is claimed is:

1. An electrical connector adapted to electrically connect a conductive strip to a circuit board, comprising:
    a housing having a main body with a receiving chamber;
    a pair of first terminals fixed in the receiving chamber and electrically connected to the conductive strip, the first terminals each having a movable contact portion extending out of the receiving chamber and a fixing portion fixing the first terminal in the receiving chamber, the movable contact portions of the pair of first terminals extend away from each other and perpendicularly from the fixing portions; and
    a second terminal fixed on a surface of the circuit board, the movable contact portions of the first terminals electrically contact the second terminal while the first terminals and the housing are moveable with respect to the second terminal along a first direction parallel to a plane defined by the surface of the circuit board, the second terminal has a plurality of first guide grooves, the movable contact portions of the pair of first terminals are movably inserted into the first guide grooves in the first direction.

2. The electrical connector of claim 1, wherein the conductive strip is perpendicular to the circuit board.

3. The electrical connector of claim 1, wherein the second terminal has a flat portion electrically connected with the circuit board and a pair of bent portions, each bent portion extends curvedly from an edge of the flat portion above the flat portion to form the first guide grooves.

4. The electrical connector of claim 3, wherein the first guide groove allows the movable contact portions to move in a second direction parallel to the plane of the circuit board and perpendicular to the first direction.

5. The electrical connector of claim 3, further comprising an elastic mechanism disposed between the movable contact portion of the first terminal and the flat portion of the second terminal, the elastic mechanism allowing the movable contact portion to move relative to the flat portion in a third direction perpendicular to the plane of the circuit board.

6. The electrical connector of claim 5, wherein the elastic mechanism includes an elastic sheet having a protrusion protruding away from the flat portion and a plurality of connecting parts connecting an edge of the elastic sheet to the flat portion.

7. The electrical connector of claim 1, wherein the second terminal has a pair of stoppers limiting the movable contact portions to move between the stoppers in the first direction.

8. The electrical connector of claim 7, wherein each of the movable contact portions has a notch receiving one of the stoppers.

9. The electrical connector of claim 8, further comprising a bolt member extending through the circuit board and the flat portion of the second terminal, and a nut member engaged with the bolt member to fix the second terminal to the circuit board, the nut member or a bolt head of the bolt member is the stopper.

10. The electrical connector of claim 1, wherein one of the first guide groove and the movable contact portion has a recess portion and the other of the first guide groove and the movable contact portion has a protruding portion, the recess portion receiving the protruding portion.

11. The electrical connector of claim 1, wherein the housing has a pair of holding arms facing each other and extending out of the main body.

12. The electrical connector of claim 11, wherein the first terminals has each have a contact extending from the fixing portion to one of the holding arms and electrically contacting the conductive strip between the holding arms.

13. The electrical connector of claim 12, wherein the contact has a base extending from the fixing portion and a folded portion protruding toward the conductive strip to clamp the conductive strip.

14. The electrical connector of claim 13, wherein the folded portion has a plurality of elastic arms spaced apart from one another.

15. The electrical connector of claim 13, wherein a pair of opposite sides of the base each have a plurality of holding portions protruding outward and penetrating an inner wall of the receiving chamber.

16. The electrical connector of claim 1, wherein the housing has a second guide channel, the fixing portions of the pair of first terminals extend through the second guide channel.

17. The electrical connector of claim 1, wherein a side portion of each of the fixing portions opposite to the movable contact portions of the first terminals has a reinforcing portion extending perpendicular to the fixing portion, the reinforcing portion inserted into a holding groove in the receiving chamber.

18. An electrical connector adapted to electrically connect a conductive strip to a circuit board, comprising:
    a housing having a main body with a receiving chamber and a pair of holding arms facing each other and extending out of the main body;
    a first terminal fixed in the receiving chamber and electrically connected to the conductive strip, the first terminal having a movable contact portion extending out of the receiving chamber, the first terminal has a fixing portion fixing the first terminal in the receiving chamber, the movable contact portion extends perpendicularly from the fixing portion; and
    a second terminal fixed on a surface of the circuit board, the movable contact portion of the first terminal electrically contacts the second terminal while the first terminal and the housing are moveable with respect to the second terminal along a first direction parallel to a plane defined by the surface of the circuit board.

19. The electrical connector of claim 18, wherein the first terminal has a contact extending from the fixing portion to one of the holding arms and electrically contacting the conductive strip between the holding arms.

20. The electrical connector of claim 19, wherein the contact has a base extending from the fixing portion and a folded portion protruding toward the conductive strip to clamp the conductive strip.

21. The electrical connector of claim 20, wherein the folded portion has a plurality of elastic arms spaced apart from one another.

22. The electrical connector of claim 20, wherein a pair of opposite sides of the base each have a plurality of holding portions protruding outward and penetrating an inner wall of the receiving chamber.

* * * * *